(12) United States Patent
Otsuki

(10) Patent No.: US 10,522,910 B2
(45) Date of Patent: Dec. 31, 2019

(54) ANTENNA DEVICE, COMMUNICATION DEVICE, AND METHOD FOR PRODUCING ANTENNA DEVICE

(71) Applicant: RICOH COMPANY, LTD., Tokyo (JP)

(72) Inventor: Takashi Otsuki, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 218 days.

(21) Appl. No.: 15/862,741

(22) Filed: Jan. 5, 2018

(65) Prior Publication Data

US 2018/0198208 A1   Jul. 12, 2018

(30) Foreign Application Priority Data

Jan. 10, 2017   (JP) .................. 2017-001687

(51) Int. Cl.
| | |
|---|---|
| *H01Q 7/04* | (2006.01) |
| *H01Q 7/06* | (2006.01) |
| *H01F 27/28* | (2006.01) |
| *G01R 33/34* | (2006.01) |
| *H04B 5/00* | (2006.01) |

(52) U.S. Cl.
CPC .......... *H01Q 7/04* (2013.01); *G01R 33/34084* (2013.01); *H01F 27/2823* (2013.01); *H01Q 7/06* (2013.01); *H04B 5/0025* (2013.01)

(58) Field of Classification Search
CPC .................. H01Q 7/06; H01Q 7/04
See application file for complete search history.

(56) References Cited

U.S. PATENT DOCUMENTS

| | | |
|---|---|---|
| 2006/0038730 A1 | 2/2006 | Parsche |
| 2006/0097595 A1 | 5/2006 | Randriamanantena |
| 2007/0056515 A1 | 3/2007 | Chevalier et al. |
| 2016/0028160 A1 | 1/2016 | Otsuki |
| 2017/0149141 A1 | 5/2017 | Otsuki |

FOREIGN PATENT DOCUMENTS

| | | |
|---|---|---|
| CN | 1783650 A | 6/2006 |
| CN | 1809911 A | 7/2006 |
| CN | 101657868 A | 2/2010 |
| CN | 105190995 A | 12/2015 |
| JP | 2006-050522 | 2/2006 |
| JP | 2010-056982 | 3/2010 |
| JP | 2013-207238 | 10/2013 |
| JP | 2014-195137 | 10/2014 |
| JP | 2015-128142 | 7/2015 |
| JP | 2017-098647 | 6/2017 |

OTHER PUBLICATIONS

Office Action dated Aug. 21, 2019, issued in corresponding Chinese Patent Application No. 201810018079.9, 9 pages.

*Primary Examiner* — Graham P Smith
(74) *Attorney, Agent, or Firm* — Xsensus LLP

(57) ABSTRACT

An antenna device includes a magnetic portion and a coil. The magnetic portion includes a plurality of magnetic pieces arranged. The plurality of magnetic pieces are individual pieces of a magnetic body. The coil is formed of a litz wire coiled around the magnetic portion. The litz wire includes a bundle of a plurality of conducting wires.

13 Claims, 15 Drawing Sheets

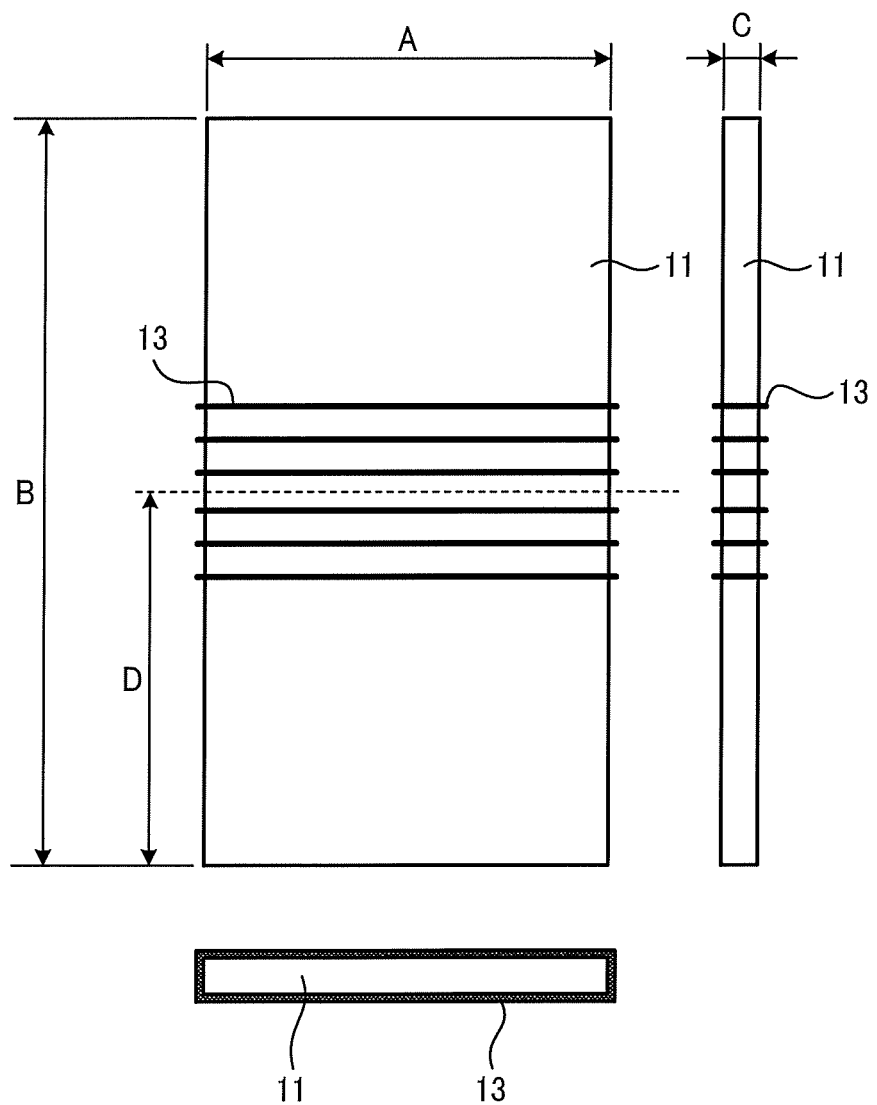

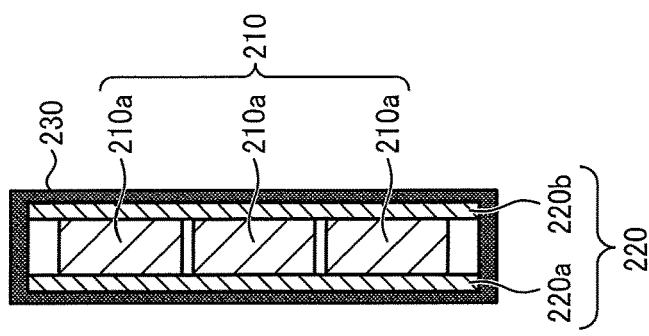
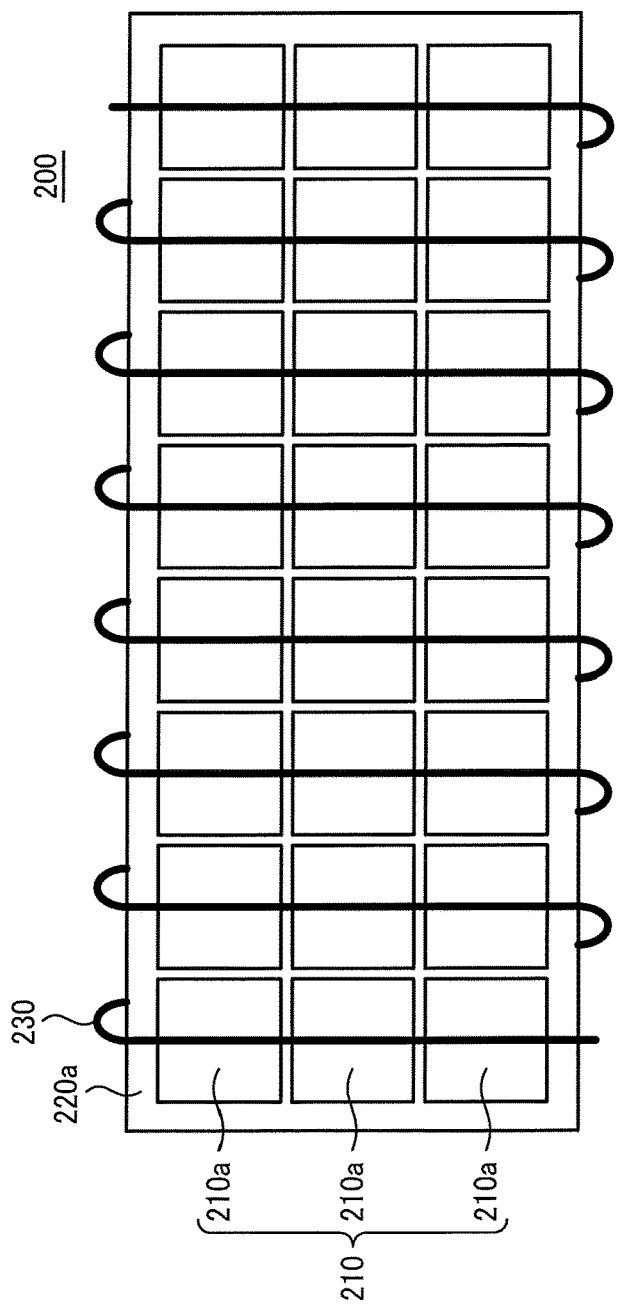
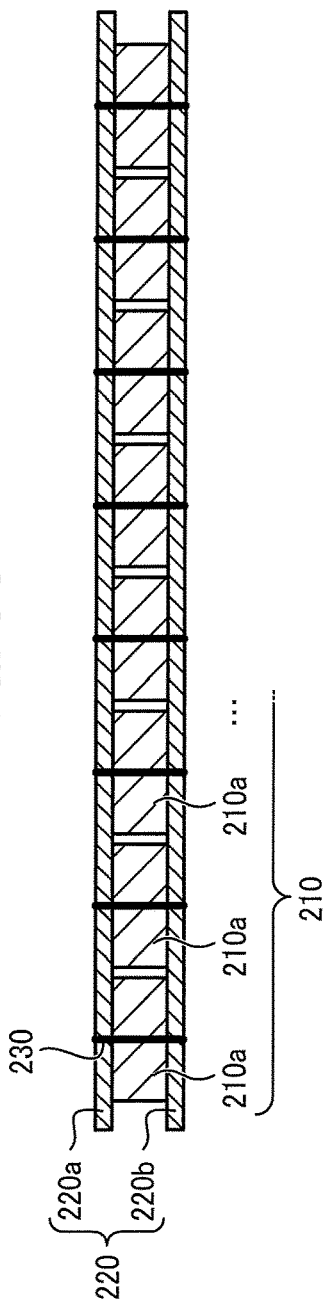

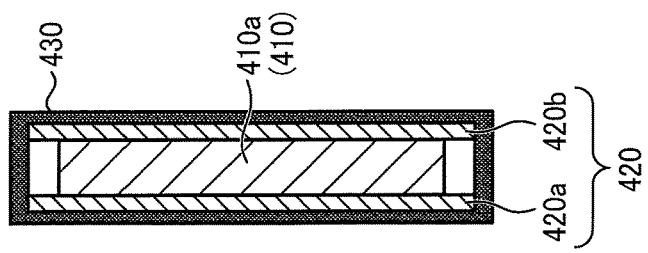
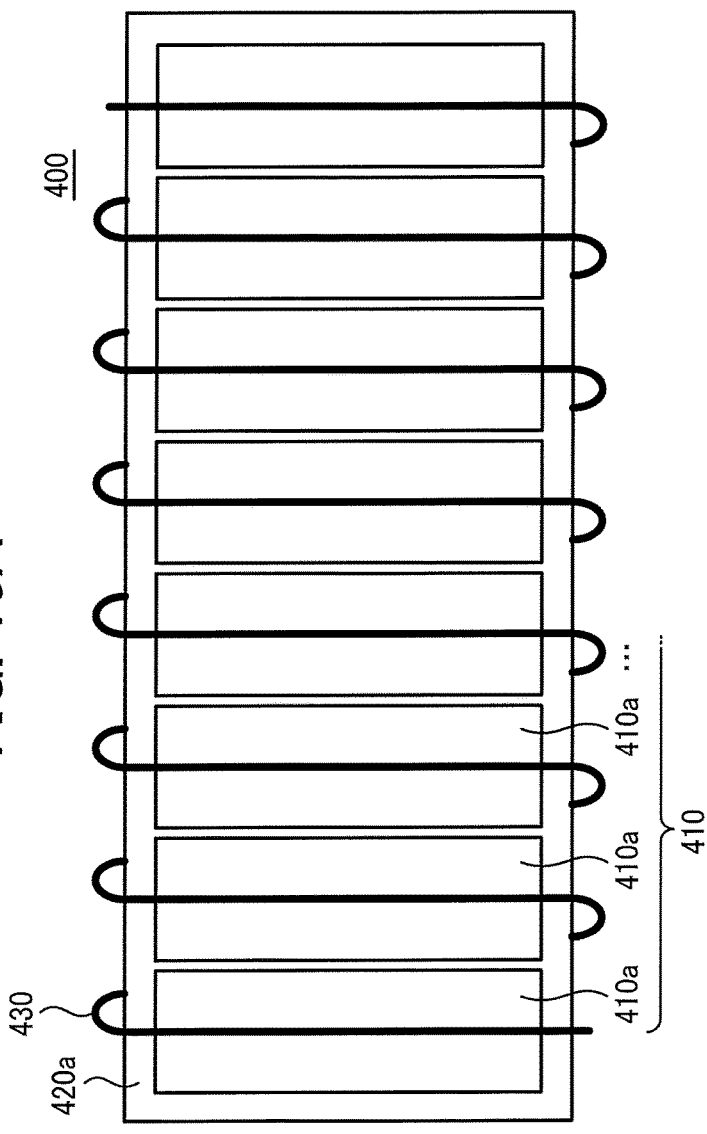
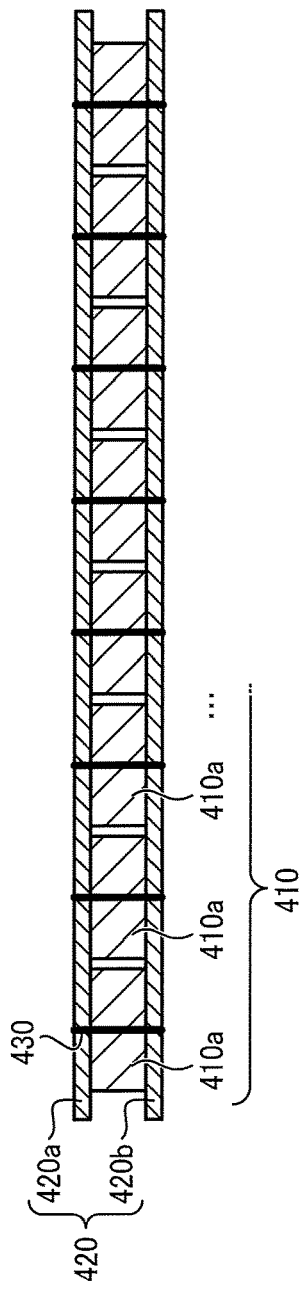

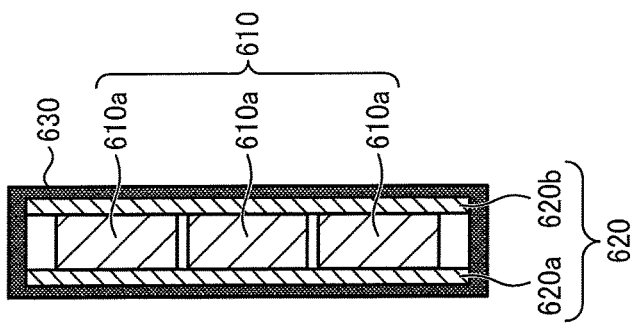
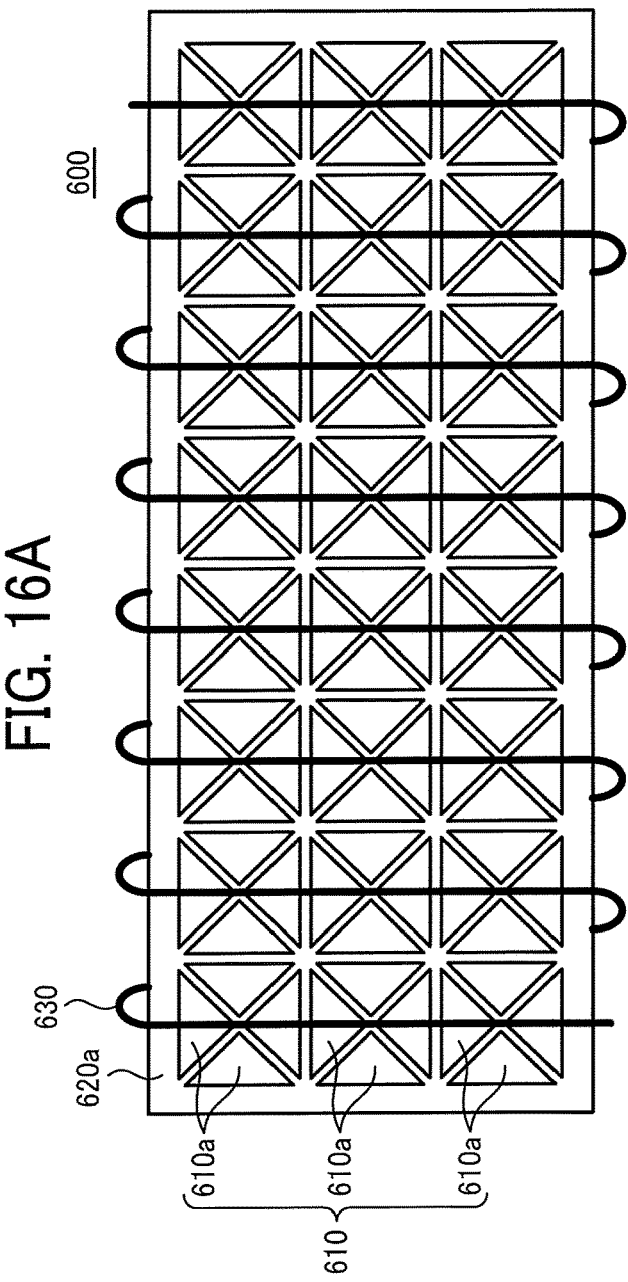
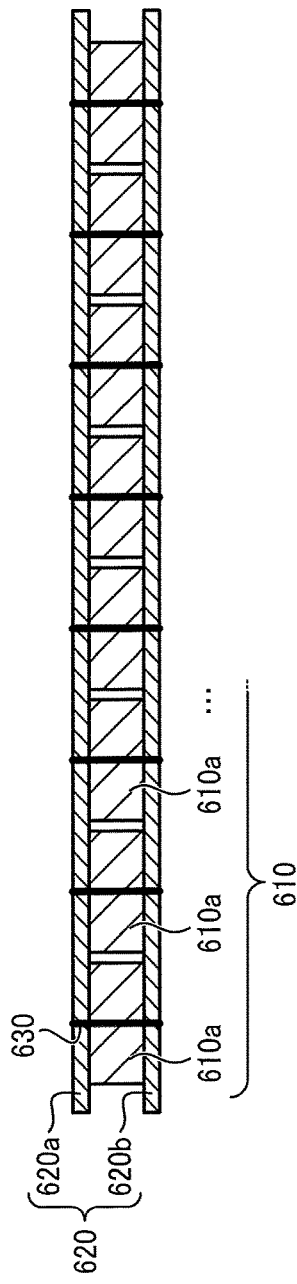

ANTENNA DEVICE, COMMUNICATION DEVICE, AND METHOD FOR PRODUCING ANTENNA DEVICE

CROSS-REFERENCE TO RELATED APPLICATION

This patent application is based on and claims priority pursuant to 35 U.S.C. § 119(a) to Japanese Patent Application No. 2017-001687, filed on Jan. 10, 2017, in the Japan Patent Office, the entire disclosure of which is hereby incorporated by reference herein.

BACKGROUND

Technical Field

Aspects of the present disclosure relate to an antenna device, a communication device, and a method for producing the antenna device.

Description of the Related Art

A communication system of a magnetic coupling type represented by near field communication (NFC) is adopted also in a portable information terminal, such as a smartphone or a wearable terminal, and an antenna to implement a function of this communication system is mounted. Due to thickness reduction and downsizing of such a portable information terminal, there is a growing demand to request size reduction and thickness reduction of the antenna to be mounted.

SUMMARY

In an aspect of the present disclosure, there is provided an antenna device that includes a magnetic portion and a coil. The magnetic portion includes a plurality of magnetic pieces arranged. The plurality of magnetic pieces are individual pieces of a magnetic body. The coil is formed of a litz wire coiled around the magnetic portion. The litz wire includes a bundle of a plurality of conducting wires.

In another aspect of the present disclosure, there is provided a communication device that includes an antenna device and a communication unit. The antenna device includes a magnetic portion and a coil. The magnetic portion includes a plurality of magnetic pieces arranged, the plurality of magnetic pieces being individual pieces of a magnetic body. The coil is formed of a litz wire coiled around the magnetic portion, the litz wire including a bundle of a plurality of conducting wires. The communication unit is coupled to the antenna device, to communicate with an external device.

In still another aspect of the present disclosure, there is provided a method for producing an antenna device. The method includes cutting a magnetic body into individual pieces to produce a plurality of magnetic pieces; arranging the plurality of magnetic pieces to form a magnetic portion; and coiling a litz wire around the magnetic portion including the magnetic pieces arranged, the litz wire including a plurality of conducting wires.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein:

FIG. 2 provides views from three sides illustrating the antenna device;

FIGS. 3A, 3B, and 3C are views from three sides illustrating an antenna device according to a first embodiment of the present disclosure;

FIGS. 10A, 10B, and 10C are views from three sides illustrating an antenna device according to a second embodiment of the present disclosure;

FIGS. 16A, 16B, and 16C are views from three sides illustrating an antenna device according to a third embodiment of the present disclosure.

Figure 1:
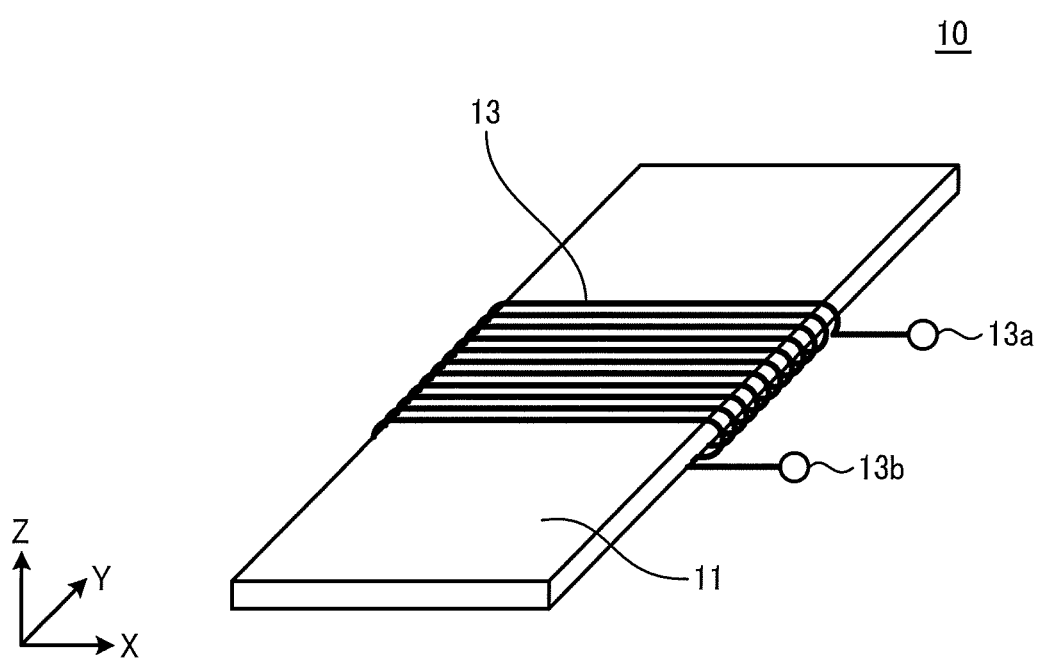
FIG. 1 is a perspective view illustrating an antenna device.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Embodiments of an antenna device, a communication device, and a method for producing an antenna device will be described in detail below referring to the accompanying drawings.

First Embodiment

First, an antenna device of a magnetic coupling type will be described. FIG. 1 is a perspective view illustrating an antenna device. FIG. 2 provides views from three sides illustrating the antenna device. In FIG. 1 and FIG. 2, an XYZ coordinate system including a rectangular coordinate system is defined for an antenna device 10.

The antenna device 10 is an antenna device of magnetic coupling type and includes a magnetic portion 11 and a coil 13 as illustrated in FIG. 1.

The antenna device 10 of a magnetic coupling type differs from an antenna device of a resonance type which transmits or receives a radio wave by causing resonance with a radio wave of a specific frequency, and performs communication by magnetic coupling with a magnetic flux generated by an antenna device to be a communication partner. Therefore, while the antenna device of the resonance type has a communication distance of several meters to several kilometers or more, the antenna device 10 of the magnetic coupling type has a communication distance of about one meter or less, for example.

In other words, the antenna device 10 of the magnetic coupling type is an antenna device for short range communication or near field communication. The antenna device 10 illustrated in FIG. 1 transmits or receives a signal having a frequency of 13.56 MHz, for example.

For example, the magnetic portion 11 is made of a sintered ferrite shaped in a rectangular parallelepiped, and for example, a length A in a short side direction (X-axis direction) is 11 mm, a length B in a long side direction (Y-axis direction) is 14 mm, and a thickness C (length in Z-axis direction) is 0.2 mm. Note that such a size of the magnetic portion 11 is an example, and the magnetic portion may be shaped in a cube in which, for example, the length A in the short side direction (X-axis direction) is 5 mm, the length B in the long side direction (Y-axis direction) is 5 mm, and the thickness C (length in the Z-axis direction) is 5 mm.

The magnetic portion 11 is shaped in a plate or a cube, but the shape can be arbitrarily determined as a shape conforming to a size, a shape, and the like of a space where the antenna device is mounted, and also determined as a shape suitable for a required communication range based on the characteristics of the antenna device. Additionally, a material of the magnetic portion 11 is not limited to the sintered ferrite, but iron, nickel, manganese, zinc, or an alloy of these materials may be also used as far as the material is a so-called ferromagnet.

Furthermore, the magnetic portion 11 may be a sheet-shaped member having flexibility, or may be a member that can be freely shaped in accordance with a shape of a housing in which the magnetic portion is mounted.

The coil 13 is formed by coiling a conducting wire around the vicinity of a center portion in the long side direction (Y-axis direction) of the magnetic portion 11 along the short side direction (X-axis direction) of the magnetic portion 11.

Therefore, in a case where the length B is 14 mm, a length D (refer to FIG. 2) is 7 mm, and in a case where the length B is 24 mm, the length D is 12 mm. The length D is a length between an end portion on a Y-axis negative direction side of the magnetic portion 11 and a center position in the Y-axis direction of the portion where the conducting wire is coiled around the magnetic portion 11.

End portions 13a and 13b on both sides of the coil 13 are coupled to a communication unit of a device performing communication using the antenna device 10. Then, the communication unit communicates with an external device.

As a conducting wire of the coil 13, a copper wire can be used, for example. The conducting wire of the coil 13 has a thickness (wire diameter) of for example, 50 μm (0.05 mm). The number of turns of coiling the conducting wire of the coil 13 is, for example, about 20 times. A coiling method in which the conducting wire of the coil 13 is coiled around the magnetic portion 11 such that adjacent turns of the conducting wire closely contact each other is referred to as "close coiling". On the other hand, a coiling method in which the conducting wire of the coil 13 is coiled such that adjacent turns of the conducting wire do not contact each other but are kept at a certain predetermined interval is referred to as "coarse coiling".

Additionally, the conducting wire used as the coil 13 has a surface applied with an enamel coat, and the conducting wire of the coil 13 with the enamel coat applied has a thickness (wire diameter) of 69 μm (0.069 mm).

Note that the above-described thickness of the conducting wire of the coil 13, number of turns of coiling, and coiling method are examples, and these details may be suitably set in accordance with, for example, a use of the antenna device 10. Furthermore, a description will be provided for a mode in which the conducting wire of the coil 13 is coiled in the short side direction of the magnetic portion 11 in the antenna device 10. The reason is that better characteristics can be obtained in a case of coiling the conducting wire of the coil 13 in the short side direction of the magnetic portion 11 as illustrated in FIG. 2 than in a case of coiling the conducting wire of the coil 13 in the long side direction of the magnetic portion 11.

In other words, a demagnetic field is generated at both ends (an end portion on the Y-axis positive direction side and the end portion on the Y-axis negative direction side) of the magnetic portion 11 by the conducting wire coiled in a loop shape in the short side direction of the magnetic portion 11. The longer a distance between a region where the conducting wire is coiled and the both ends of the magnetic portion 11 is, the less an influence of such a demagnetic field becomes. Additionally, in a case where the conducting wire is coiled in the long side direction of the magnetic portion 11, a cross sectional area is increased more than in a case where the conducting wire is coiled in the short side direction, and therefore, magnetic resistance is reduced.

Due to the above reasons, the conducting wire of the coil 13 may be coiled in the short side direction of the magnetic portion 11 in the antenna device 10, and the magnetic portion 11 may be shaped in a rectangle (in a case of viewing a top surface of FIG. 1 from above). Additionally, the conducting wire of the coil 13 may be coiled around the center portion rather than the end portion of the magnetic portion 11.

Next, an antenna device 200 of the present embodiment will be described. FIGS. 3A, 3B, and 3C are views from three sides illustrating the antenna device according to a first embodiment. The antenna device 200 of the present embodiment has a magnetic portion 210 having a structure paved with magnetic pieces 210a instead of adopting a single sheet having flexibility like the magnetic portion 11 of the antenna device 10. The antenna device 200 mainly includes a magnetic portion 210, resin members 220, and a coil 230.

The magnetic portion 210 is paved with the magnetic pieces 210a arranged at equal intervals. Each magnetic piece 210a is shaped in a rectangular parallelepiped shape. This magnetic piece 210a is produced by cutting, into individual pieces, a plate-shaped magnetic body shaped in a rectangular parallelepiped like the magnetic portion 11. In the present embodiment, each magnetic piece 210a is shaped in a square having with a side length of 2 mm. Meanwhile, a material quality of the magnetic portion 210 is similar to a material quality of the antenna device 10.

The resin members 220 sandwich the magnetic portion 210 and secure the magnetic pieces 210a at predetermined positions. The resin member 220 may be, for example, polyethylene terephthalate (PET) or a resin having heat resistance such as polyimide.

The coil 230 is formed by coiling a litz wire a plurality of times in coarse coiling along a short side direction (X-axis direction) of the magnetic portion 210 having the magnetic pieces 210a arranged. The litz wire is formed by combining a plurality of conducting wires. Additionally, in the coil 230, a predetermined interval is kept between adjacent turns of the litz wire coiled around the magnetic portion 210. With this structure, the litz wire is coiled around the entire magnetic portion 210, and a magnetic flux can be generated from each of the magnetic pieces 210a.

Here, a resistance value in a case where current flows in the conducting wire will be described. The resistance value of the conducting wire has a DC resistance to a DC component of the current flowing in the conducting wire and AC resistance to a high frequency component. The higher the frequency is, the more increased AC resistance is by a skin effect. In other words, the higher the frequency is, the more increased a power loss of the conducting wire is, and the magnetic field is hardly generated. In contrast, in the present embodiment, produced is the antenna device 200 in which the litz wire formed by combining the plurality of conducting wires is coiled around the magnetic portion 210.

A material quality of the conducting wire forming the litz wire is similar to a material quality of the conducting wire of the antenna device 10, and an enamel coat is applied. Furthermore, the litz wire is formed by gathering and combining the plurality of conducting wires (conductor strands) insulated by the enamel coat. Since such a litz wire is used, the current flowing in the conducting wire is dispersed. Consequently, the power loss is reduced by suppressing the AC resistance, and a magnetic field can be efficiently generated. Note that the litz wire can be formed by combining the desired number of the conducting wires suitable for the antenna device. Additionally, the litz wire of the present embodiment can be formed by directly bundling the plurality of conducting wires or may be formed by twisting and bundling the plurality of conducting wires.

Figure 4:
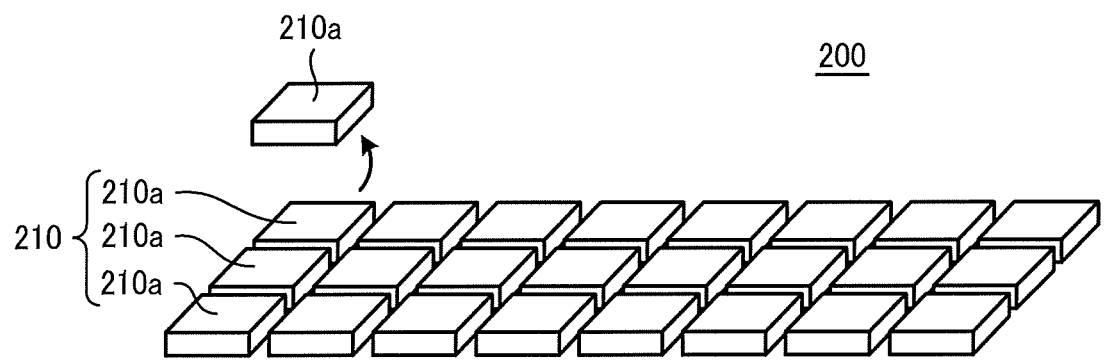
FIG. 4 is a view illustrating an example in which magnetic pieces are arranged.
Figure 5:
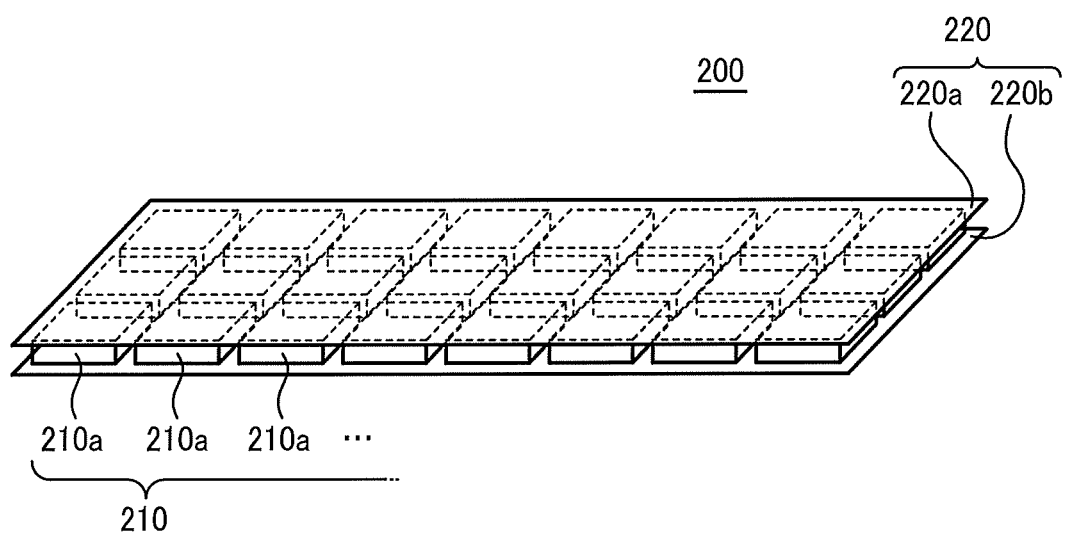
FIG. 5 is a view illustrating an example in which a magnetic portion including the magnetic pieces arranged is sandwiched between resin members.
Figure 6:
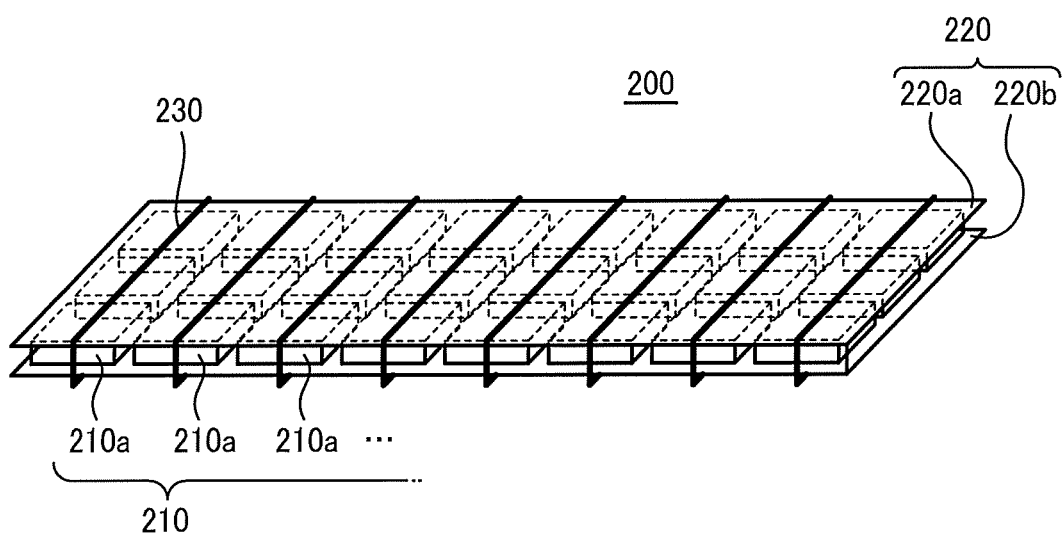
FIG. 6 is a view illustrating an example in which a litz wire is coiled around the magnetic portion.

Next, a method for producing the antenna device 200 will be described referring to the drawings. FIG. 4 is a view illustrating an example in which the magnetic pieces are arranged. FIG. 5 is a view illustrating an example in which the magnetic portion including the magnetic pieces arranged is sandwiched between the resin members. FIG. 6 is a view illustrating an example in which the litz wire is coiled around the magnetic portion.

To produce the antenna device 200 of present embodiment, the plate-shaped magnetic body shaped in the rectangular parallelepiped is first cut into individual pieces to produce a plurality of magnetic pieces 210a. Next, as illustrated in FIG. 4, the plurality of individualized magnetic pieces 210a are arranged at equal intervals to from the magnetic portion 210 in the antenna device 200. Since the magnetic pieces 210a are arranged at equal intervals, magnetic force can be generated in a good balance. In the magnetic portion 210 of the antenna device 200 of the present embodiment, the magnetic pieces 210a are arranged in an array of 8×3.

Then, as illustrated in FIG. 4, the magnetic portion 210 having the magnetic pieces 210a arranged is sandwiched and secured between the resin members 220 (resin members 220a and 220b) as illustrated in FIG. 5. In other words, the magnetic pieces 210a are secured at desired positions by disposing the resin member 220a from an upper side and the resin member 220b from a lower side with respect to the magnetic portion 210.

Then, as illustrated in FIG. 6, the litz wire is coiled around the magnetic portion 210 sandwiched between the resin members 220 to form the coil 230, and thus the antenna device 200 is produced.

Next, a magnetic flux density of the antenna device 200 will be described. FIGS. 7A to 9B illustrate results of simulating characteristics of magnetic flux vectors in a case where one magnetic body is used as the magnetic portion of the antenna device and in a case where square magnetic pieces 210a are arranged to form the magnetic portion 210 of the antenna device 200.

Figure 7A:
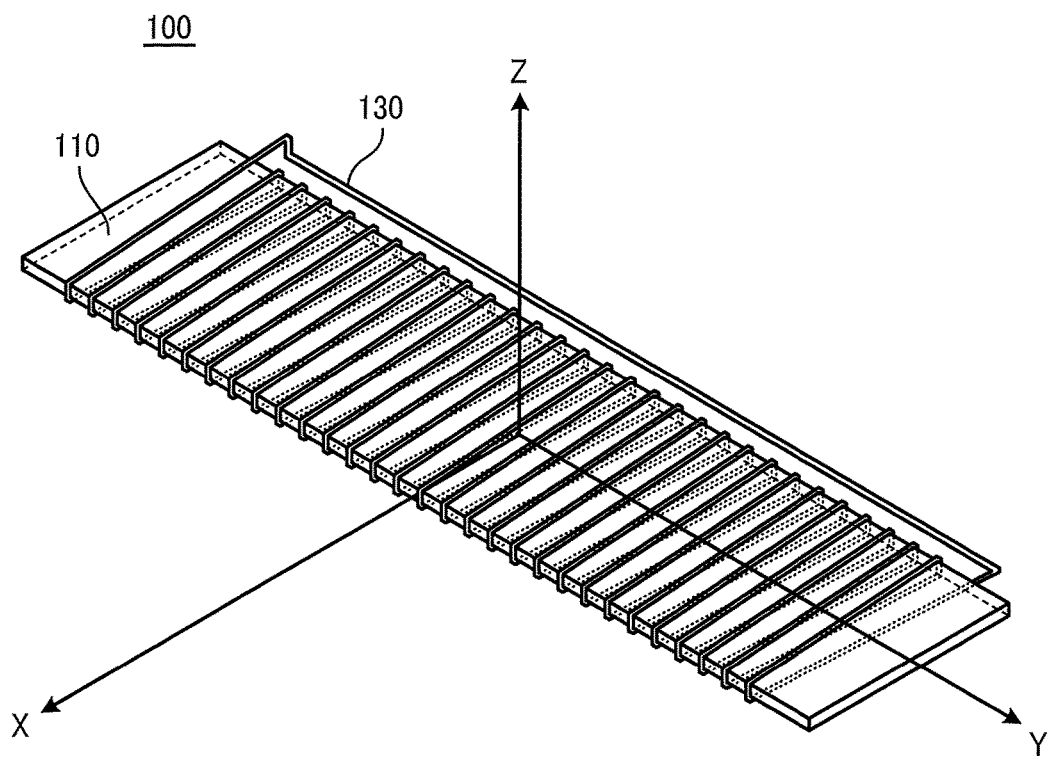
FIGS. 7A and 7B are views illustrating a simulation result of a magnetic flux density around the antenna device.
Figure 7B:
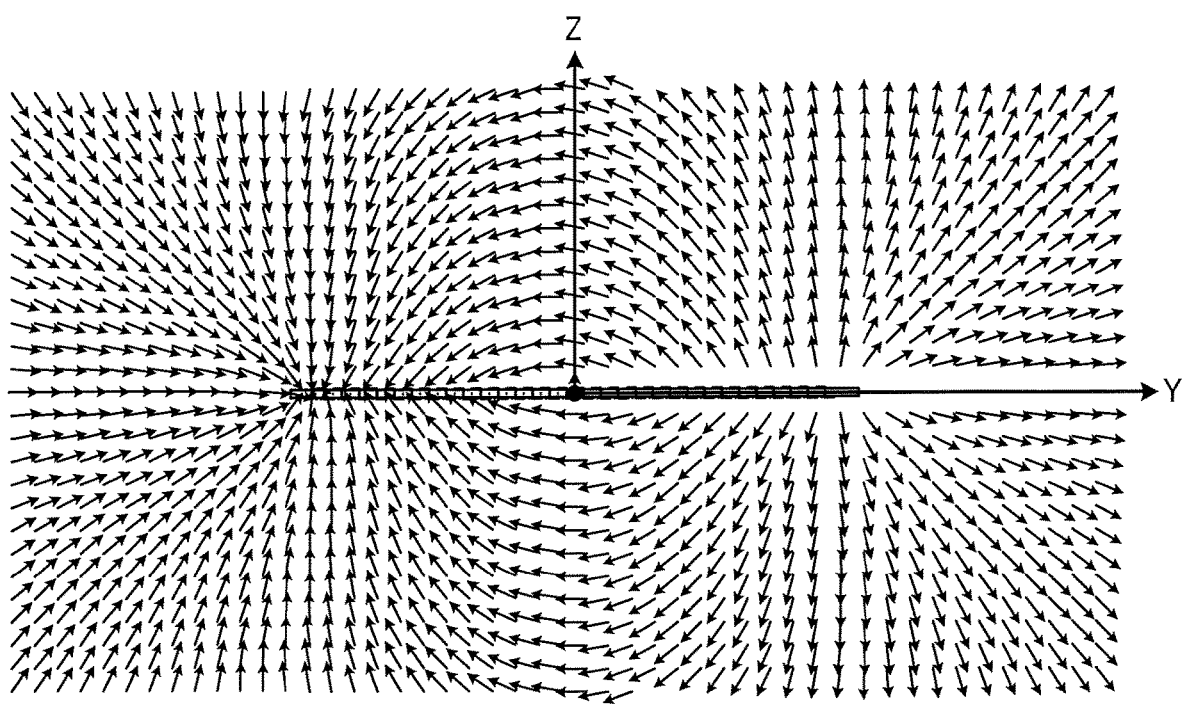

FIGS. 7A and 7B are views illustrating a simulation result of the magnetic flux density around the antenna device. The magnetic portion 110 illustrated in FIGS. 7A and 7B is a single-plate magnetic body or formed by arranging individualized magnetic pieces without any gap.

A simulation model illustrated in FIG. 7A is a 3D model of the antenna device 100, and a conducting wire forming the coil 130 is coiled around the plate-shaped magnetic portion 110. A simulation result of FIG. 7B is a result of performing an electromagnetic field simulation by using the simulation model of FIG. 7A and movement of each magnetic flux in a YZ plane is observed. An arrow illustrated in FIG. 7B represents a magnetic flux vector and indicates that a magnetic flux is generated in a pointing direction of the arrow.

The magnetic portion 110 in FIGS. 7A and 7B has a size of 3 mm in the X-axis direction and 12 mm in the Y-axis direction. This can be assumed that a plurality of magnetic pieces each having a side length of 1 mm are arranged in an array of 3×12 (=36 pieces) without any gap.

Figure 8A:
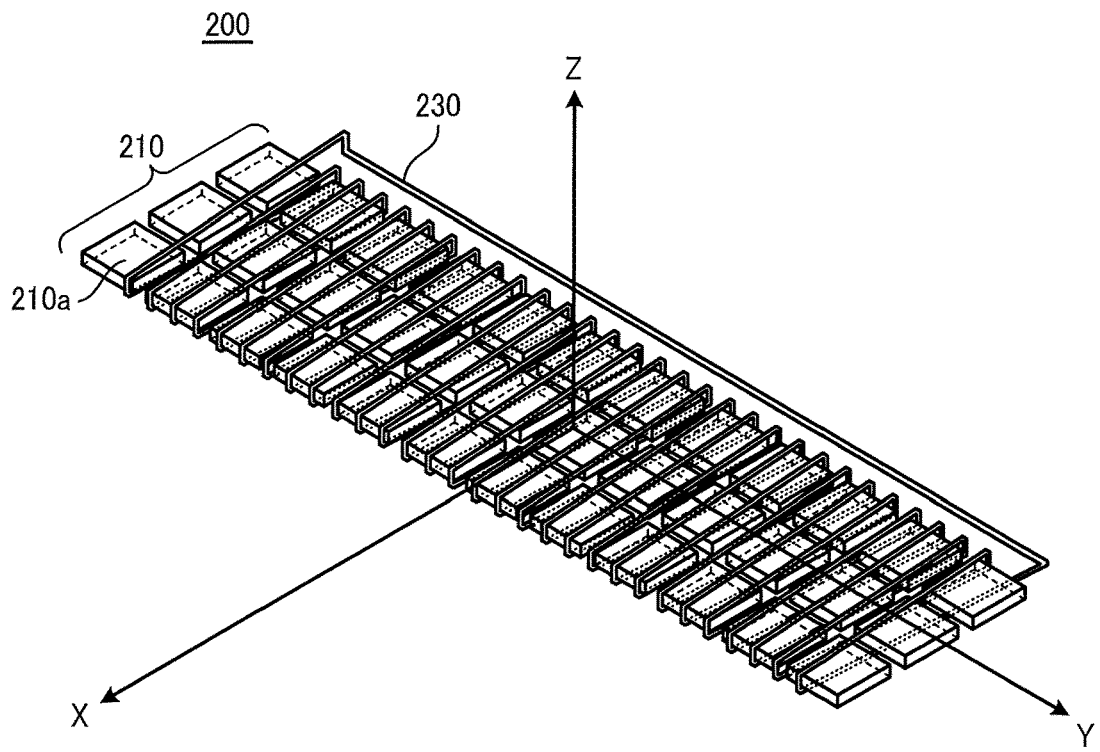
FIGS. 8A and 8B are views illustrating a simulation result of a magnetic flux density around the antenna device in a case where square magnetic pieces are arranged to form the magnetic portion.
Figure 8B:
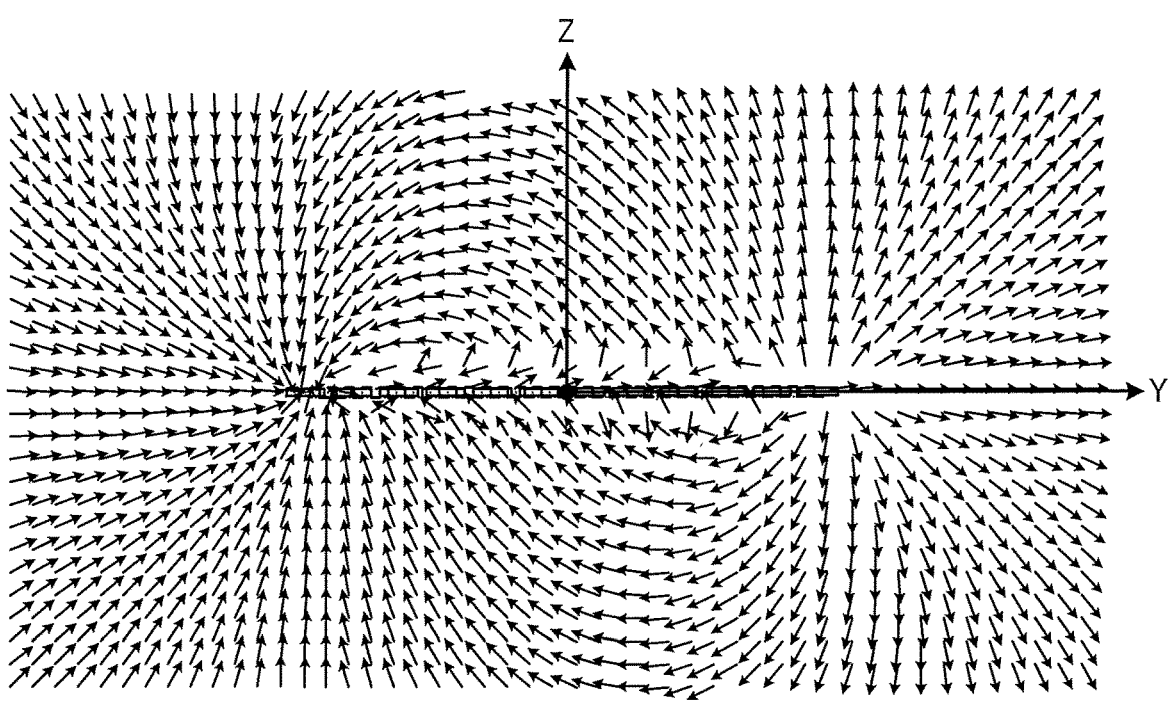

FIGS. 8A and 8B are views illustrating a simulation result of a magnetic flux density around the antenna device in a case where square magnetic pieces are arranged to form the magnetic portion in a magnetic portion 210 illustrated in FIG. FIGS. 8A and 8B, a gap between the respective magnetic pieces 210a is set to 0.2 mm.

A simulation model illustrated in FIG. 8A is a 3D model of the antenna device 200, and a litz wire forming the coil 230 is coiled around the magnetic portion 210. A simulation result of FIG. 8B is a result of performing an electromagnetic field simulation by using the simulation model of FIG. 8A and movement of each magnetic flux in the YZ plane is observed. An arrow illustrated in FIG. 8B represents a magnetic flux vector and indicates that a magnetic flux is generated in a pointing direction of the arrow.

In the antenna device 200 of FIGS. 8A and 8B, a single-plate magnetic body is cut into individual pieces and the individual pieces are arranged in an array of 3×12 (=36 pieces). Additionally, each magnetic piece 210a has one side length of 0.8 mm. In other words, assuming that the magnetic piece of the antenna device 100 has one side length of 1 mm, it can be considered that the magnetic piece 210a is obtained by reducing the one side length of the magnetic piece of the antenna device 100 to 80%.

Additionally, a size after arranging the magnetic pieces 210a is 2.8 mm in the X-axis direction and 11.8 mm in the Y-axis direction. Furthermore, the similar results can be also obtained in a case of setting a gap between the magnetic pieces 210a to 0.2 mm while one side length of the magnetic piece 210a is kept at 1 mm.

Figure 9A:
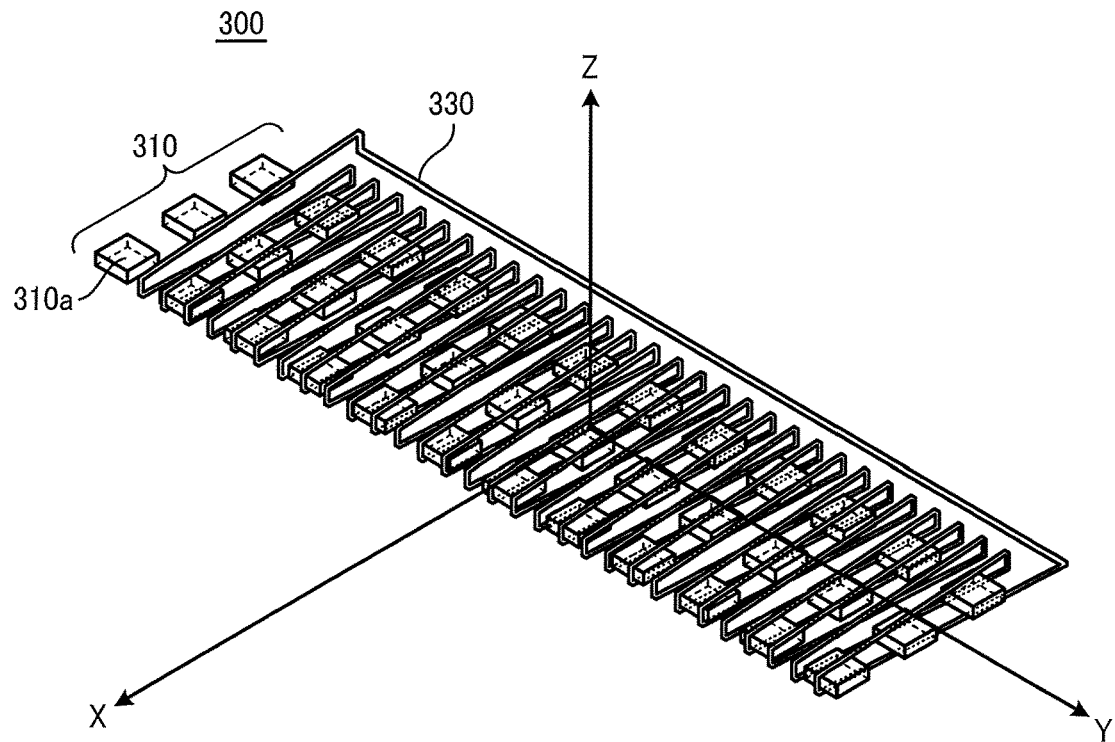
FIGS. 9A and 9B are views illustrating a simulation result of a magnetic flux density around a different antenna device in a case where square magnetic pieces are arranged to form a magnetic portion.
Figure 9B:
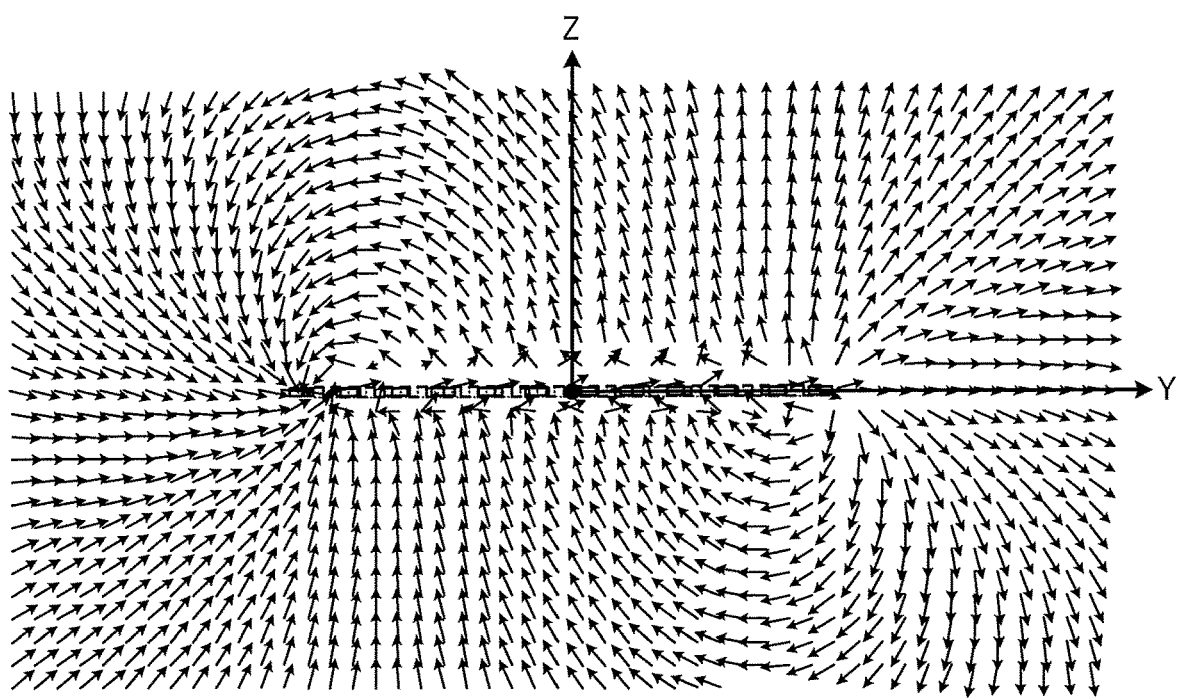

FIGS. 9A and 9B are views illustrating a simulation result of a magnetic flux density around a different antenna device in a case where square magnetic pieces are arranged to form a magnetic portion. In a magnetic portion 310 illustrated in FIGS. 9A and 9B, a gap between respective magnetic pieces 310a is set to 0.5 mm.

A simulation model illustrated in FIG. 9A is a 3D model of the antenna device 300, and a litz wire forming a coil 330 is coiled around the magnetic portion 310. A simulation result of FIG. 9B is a result of performing an electromagnetic field simulation by using the simulation model of FIG. 9A and movement of each magnetic flux in the YZ plane is observed. An arrow illustrated in FIG. 9B represents a magnetic flux vector and indicates that a magnetic flux is generated in a pointing direction of the arrow.

In the antenna device 300 of FIG. 9A, a single-plate magnetic body is cut into individual pieces and the individual pieces are arranged in an array of 3×12 (=36 pieces). Additionally, each magnetic piece 310a has one side length of 0.5 mm. In other words, assuming that the magnetic piece of the antenna device 100 has the one side length of 1 mm, it can be considered that the magnetic piece 310a is obtained by reducing the one side length of the magnetic piece of the antenna device 100 to 50%.

Then, a size after arranging the magnetic pieces 310a is 2.5 mm in the X-axis direction and 11.5 mm in the Y-axis direction. Additionally, the similar results can be also obtained in a case of setting a gap between the magnetic pieces 310a to 0.5 mm while the one side length of the magnetic piece 310a is kept at 1 mm.

Following points can be grasped from the above simulation results (FIGS. 7A to 9B).

In a case of arranging the magnetic pieces without any gap to for, the magnetic portion 110 of the antenna device 100, it can be grasped that magnetic flux vectors are generated from one end face toward the other end face and there is almost no magnetic flux vector directed in the Z-axis direction from a portion sandwiched between both end faces (see FIGS. 7A and 7B).

As illustrated in FIGS. 7A and 7B, in the case of arranging the plurality of magnetic pieces without any gap, the magnetic fluxes can be mainly generated from the antenna device 100 in the X-axis direction and the Y-axis direction.

On the other hand, in the case of forming the magnetic portion 210 of the antenna device 200 by arranging the magnetic pieces 210a at certain intervals, magnetic flux vectors directed in the Z-axis direction from the portion sandwiched between both end faces are increased in addition to the magnetic flux vectors directed to the one end face to the other end face (refer to FIGS. 8A and 8B).

In the magnetic portion 210 illustrated in FIGS. 8A and 8B, the plurality of magnetic pieces 210a are arranged such that the gap (0.2 mm) between the magnetic pieces becomes 25% of one side length (0.8 mm) of the magnetic piece 210a. In a case of thus arranging the plurality of magnetic pieces 210a with the gap of less than 50% of one side of the magnetic piece 210a, magnetic fluxes can be uniformly generated from the antenna device 200 in the X-axis direction, Y-axis direction, and Z-axis direction.

Furthermore, in a case of widening the gap between the magnetic pieces 310a at the time of arranging the magnetic pieces 310a, it can be grasped that more number of magnetic flux vectors are directed in the Z-axis direction from the portion sandwiched between both end faces (refer to FIGS. 9A and 9B).

In the magnetic portion 310 illustrated in FIGS. 9A and 9B, the plurality of magnetic pieces 310a are arranged such that the gap (0.5 mm) between the magnetic pieces becomes 100% of one side length (0.5 mm) of the magnetic piece 310a. In a case of thus arranging the plurality of magnetic pieces 310a with the gap of equal to or more than 50% of the one side of the magnetic piece 310a, magnetic fluxes can be mainly generated from the antenna device 300 in the Z-axis direction.

The phenomenon that the more number of magnetic flux vectors are generated in the Z-axis direction from the portion sandwiched between both end faces of the magnetic portion indicates that a place having a strong magnetic field intensity is generated not only on both end faces but also the portion sandwiched between both end faces. Thus, since the magnetic pieces 210a and 310a each shaped in a rectangular parallelepiped are arranged at predetermined intervals to from in the magnetic portions 210 and 310 in the antenna devices 200 and 300 of the first embodiment, a communicable area can be more expanded than in the case of the antenna device 10 in which a single-plate magnetic body is used to formed the magnetic portion 11.

Additionally, in the antenna devices 200 and 300 of the first embodiment, the coils 230 and 330 are formed by coiling, around the respective magnetic portions 210 and 310, the litz wires each formed by combining a plurality of conducting wires. Since the litz wire is thus used, current flows in a dispersed manner even in a case where AC resistance of the conducting wire is increased due to the skin effect. Therefore, a power loss can be reduced by suppressing the AC resistance, and the magnetic field can be efficiently generated.

Second Embodiment

In an antenna device of a first embodiment, square magnetic pieces are arranged to form a magnetic portion, but the magnetic piece may also have a shape other than a square shape. In an antenna device of the present embodiment, magnetic pieces each shaped in a rectangle are arranged to form a magnetic portion.

FIGS. 10A, 10B, and 10C are views from three sides illustrating an antenna device according to a second embodiment. An antenna device 400 of the present embodiment mainly includes a magnetic portion 410, resin members 420, and a coil 430.

The magnetic portion 410 is paved with magnetic pieces 410a arranged at equal intervals. Each magnetic piece 410a is shaped in a rectangular parallelepiped. Similar to the first embodiment, the magnetic piece 410a is produced by cutting, into individual pieces, a plate-shaped magnetic body shaped in a rectangular parallelepiped like a magnetic portion 11. In the present embodiment, the magnetic piece 410a is shaped in a rectangle having a long side of 6 mm and a short side 2 mm, for example. Note that a material quality of the magnetic portion 410 is similar to a material quality in a case of antenna device 10.

The resin members 420 are similar to resin members of the first embodiment, and sandwich the magnetic portion 410 to secure the magnetic pieces 410a.

The coil 430 is similar to a coil of the first embodiment, and formed by coiling a litz wire a plurality of times in coarse coiling along a short side direction (X-axis direction) of the magnetic portion 410 having the magnetic pieces 410a arranged. The litz wire is formed combining a plurality of conducting wires. Additionally, in the coil 430, a predetermined distance is kept between adjacent turns of the litz wire coiled around the magnetic portion 410. Meanwhile, a material quality, a thickness, and the like of the conducting wire forming the litz wire of the coil 430 are similar to a material quality, a thickness, and the like in a case of the antenna device 10, and an enamel coat is applied. Also, the litz wire is similar to a litz wire of the first embodiment.

Figure 11:
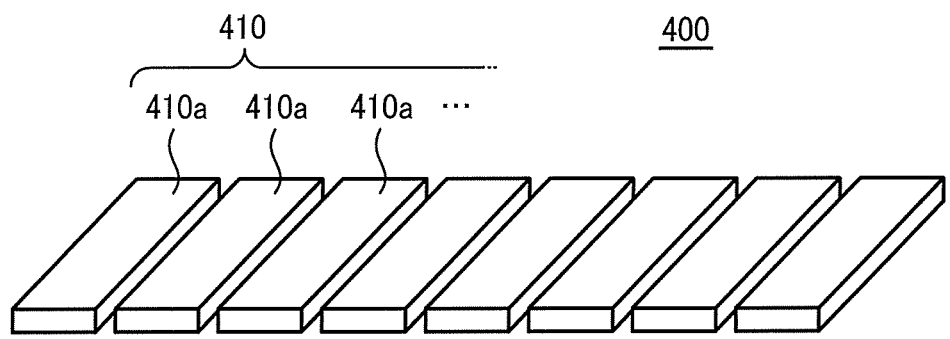
FIG. 11 is a view illustrating an example in which magnetic pieces are arranged.
Figure 12:
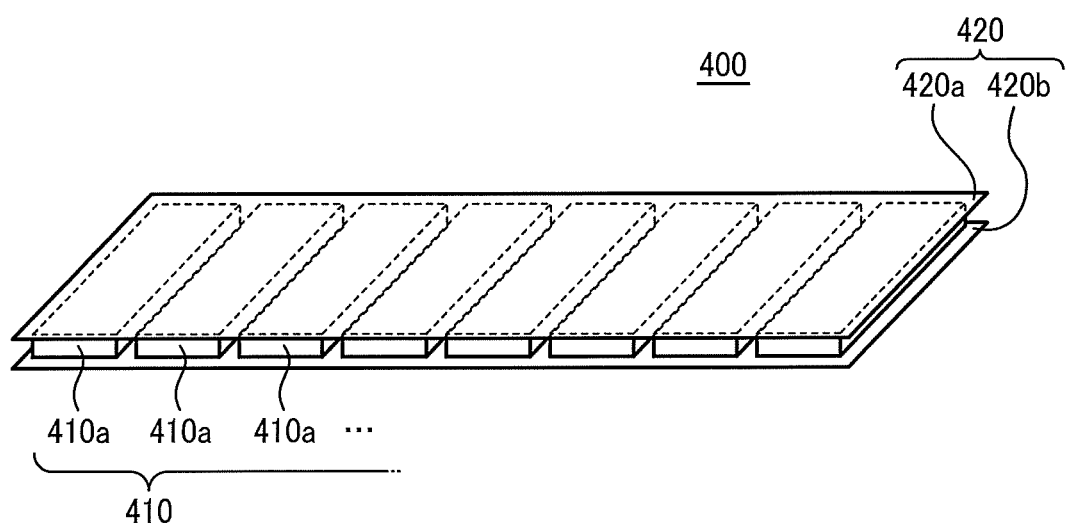
FIG. 12 is a view illustrating an example in which a magnetic portion including the magnetic pieces arranged is sandwiched between resin members.
Figure 13:
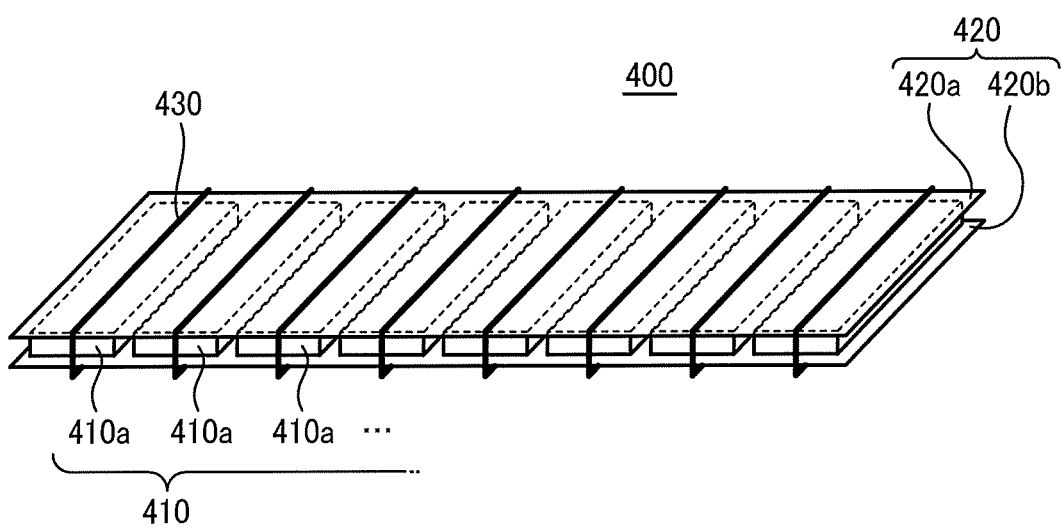
FIG. 13 is a view illustrating an example in which a litz wire is coiled around the magnetic portion.

Next, a method for producing the antenna device 400 will be described referring to the drawings. FIG. 11 is a view illustrating an example in which the magnetic pieces are arranged. FIG. 12 is a view illustrating an example in which the magnetic portion including the magnetic pieces arranged is sandwiched between the resin members. FIG. 13 is a view illustrating an example in which the litz wire is coiled around the magnetic portion.

To produce the antenna device 400 of present embodiment, the plate-shaped magnetic body shaped in a rectangular parallelepiped is first cut into individual pieces to produce the plurality of magnetic pieces 410a. Next, as illustrated in FIG. 11, the plurality of individualized magnetic pieces 410a are arranged at equal intervals to form the magnetic portion 410 in the antenna device 400. In the magnetic portion 410 of the antenna device 400 of the present embodiment, the magnetic pieces 410a are arranged in eight rows.

Then, as illustrated in FIG. 11, the magnetic portion 410 having the magnetic pieces 410a arranged is sandwiched and secured between the resin members 420 (resin members 420a and 420b) as illustrated in FIG. 12. In other words, the magnetic pieces 410a are secured at predetermined positions by disposing the resin member 420a from an upper side and the resin member 420b from a lower side with respect to the magnetic portion 410.

Then, as illustrated in FIG. 13, the litz wire is coiled around the magnetic portion 410 sandwiched between the resin members 420 to form the coil 430, and thus the antenna device 400 is produced.

Figure 14A:
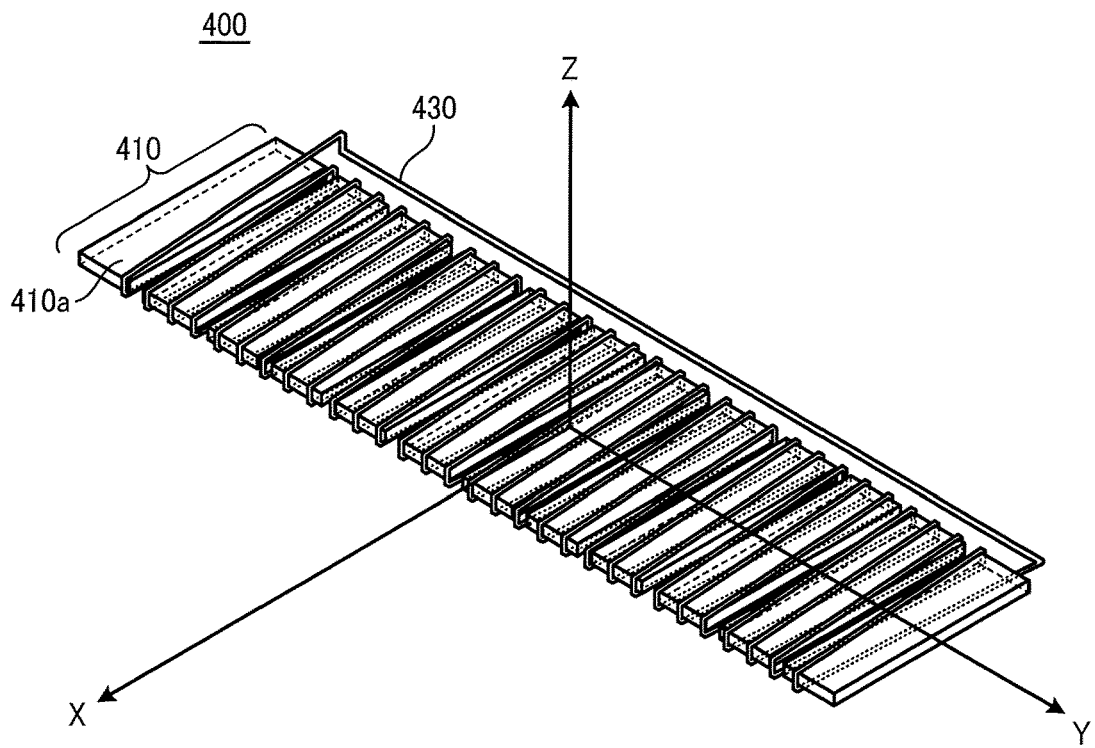
FIGS. 14A and 14B are views illustrating a simulation result of a magnetic flux density around the antenna device in a case where rectangular magnetic pieces are arranged to form the magnetic portion.
Figure 14B:
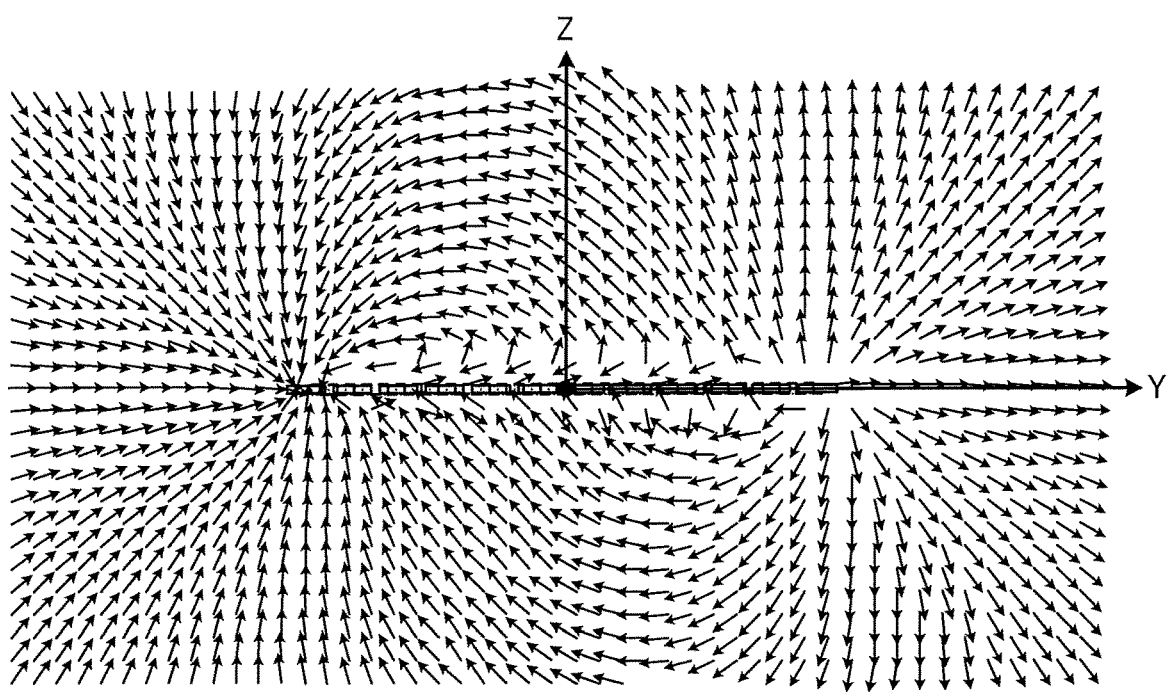

Next, a magnetic flux density of the antenna device 400 will be described. FIGS. 14A and 14B illustrate results of simulating characteristics of magnetic flux vectors in a case where rectangular magnetic pieces 410a are arranged to form the magnetic portion 410 of the antenna device 400.

FIGS. 14A and 14B are views illustrating a simulation result of a magnetic flux density around the antenna device in a case where the rectangular magnetic pieces are arranged to form the magnetic portion. In the magnetic portion 410 illustrated in FIGS. 14A and 14B, a gap between the respective magnetic pieces 410a is set to 0.2 mm.

A simulation model illustrated in FIG. 14A is a 3D model of the antenna device 400, and a litz wire forming the coil 430 is coiled around the magnetic portion 410. A simulation result of FIG. 14B is a result of performing an electromagnetic field simulation by using the simulation model of FIG. 14A and movement of each magnetic flux in a YZ plane is observed. An arrow illustrated in FIG. 14B represents a magnetic flux vector and indicates that a magnetic flux is generated in a pointing direction of the arrow.

In the antenna device 400 in FIGS. 14A and 14B, a single-plate magnetic body is cut into individual pieces in the Y-axis direction and the individual pieces are arranged in an array of 1×12 (=12 pieces). Additionally, each magnetic piece 410a has a short side length of 0.8 mm. In other words, assuming that a magnetic piece of an antenna device 100 has a short side length of 1 mm, it can be considered that the magnetic piece 410a is obtained by reducing the short side length of the magnetic piece of the antenna device 100 to 80%.

Then, a size after arranging the magnetic pieces 410a is 3 mm in the X-axis direction and 11.8 mm in the Y-axis direction. Additionally, the similar results can be also obtained in a case of setting a gap between the magnetic pieces 410a to 0.2 mm while the short side length of the magnetic piece 410a is kept at 1 mm.

Figure 15A:
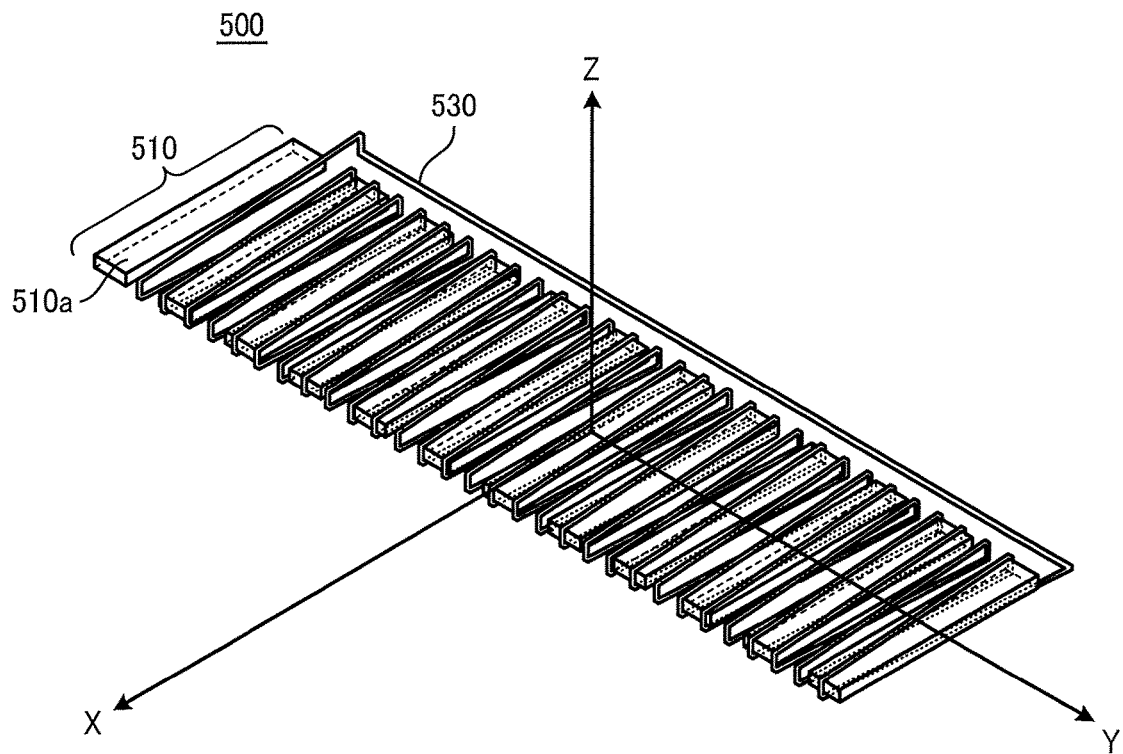
FIGS. 15A and 15B are views illustrating a simulation result of a magnetic flux density around a different antenna device in a case where rectangular magnetic pieces are arranged to form a magnetic portion.
Figure 15B:
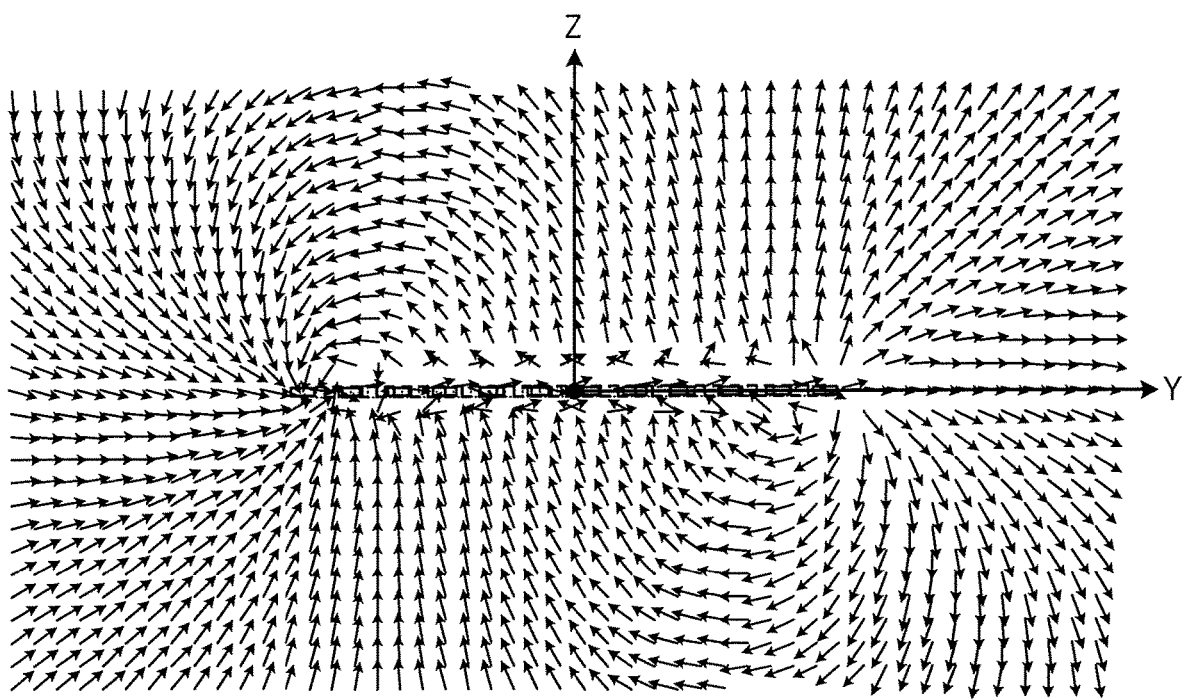

FIGS. 15A and 15B are views illustrating a simulation result of a magnetic flux density around a different antenna device in a case where rectangular magnetic pieces are arranged to form a magnetic portion. In a magnetic portion 510 illustrated in FIGS. 15A and 15B, a gap between the respective magnetic pieces 510a is set to 0.5 mm.

A simulation model illustrated in FIG. 15A is a 3D model of the antenna device 500, and a litz wire forming a coil 530 is coiled around the magnetic portion 510. A simulation result of FIG. 15B is a result of performing an electromagnetic field simulation by using the simulation model of FIG. 15A and movement of each magnetic flux in the YZ plane is observed. An arrow illustrated in FIG. 15B represents a magnetic flux vector and indicates that a magnetic flux is generated in a pointing direction of the arrow.

In the antenna device 500 of FIGS. 15A and 15B, a single-plate magnetic body is cut into individual pieces and the individual pieces are arranged in an array of 1×12 (=12 pieces). Additionally, each magnetic piece 510a has a short side length of 0.5 mm. In other words, assuming that the magnetic piece of the antenna device 100 has a short side length of 1 mm, it can be considered that the magnetic piece 510a is obtained by reducing the short side length of the magnetic piece of the antenna device 100 to 50%.

Then, a size after arranging the magnetic pieces 510a is 3 mm in the X-axis direction and 11.5 mm in the Y-axis direction. Additionally, the similar results can be also obtained in a case of setting a gap between the magnetic pieces 510a to 0.5 mm while the short side length of the magnetic piece 510a is kept at 1 mm.

Following points can be grasped from the above simulation results (FIGS. 14A to 15B).

Compared to a case of arranging magnetic pieces without any gap to form a magnetic portion 110 of the antenna device 100 as illustrated in FIGS. 7A and 7B, in the case of arranging the magnetic pieces 410a at certain intervals to form the magnetic portion 410 of the antenna device 400, magnetic flux vectors in the Z-axis directed from the portion sandwiched between both end faces are increased in addition to the magnetic flux vectors directed to one end face to the other end face (refer to FIGS. 14A and 14B).

In the magnetic portion 410 illustrated in FIGS. 14A and 14B, the plurality of magnetic pieces 410a are arranged such that the gap (0.2 mm) becomes 25% of the short side (0.8 mm) of the magnetic piece 410a. In a case of thus arranging the plurality of magnetic pieces 410a at the gap of less than 50% of one side of the magnetic piece 410a, magnetic fluxes can be uniformly generated from the antenna device 400 in the X-axis direction, Y-axis direction, and Z-axis direction.

Furthermore, in a case of widening the gap between the magnetic pieces 510a at the time of arranging the magnetic pieces 510a, it can be grasped that the more number of magnetic flux vectors are directed in the Z-axis direction from the portion sandwiched between the both end faces (see FIGS. 15A and 15B).

In the magnetic portion 510 illustrated in FIGS. 15A and 15B, the plurality of magnetic pieces 510a are arranged such that the gap (0.5 mm) between the magnetic pieces 510a becomes 100% of the short side (0.5 mm) of the magnetic piece 510a. In a case of thus arranging the plurality of magnetic pieces 510a at the gap equal to or more than 50% of one side of the magnetic piece 510a, magnetic fluxes can be mainly generated from the antenna device 500 in the Z-axis direction.

The phenomenon that the more number of magnetic flux vectors are generated in the Z-axis direction from the portion sandwiched between both end faces of the magnetic portion indicates that a place having a strong magnetic field intensity is generated not only on both end faces but also the portion sandwiched between both end faces. Thus, since the magnetic pieces 410a and 510a each shaped in a rectangular parallelepiped are arranged side by side to form the respective magnetic portions 410 and 510 in the antenna devices 400 and 500 of the second embodiment, communicable area can be more expanded than in the case of the antenna device 10 in which a single-plate magnetic body is used to form the magnetic portion 11.

Additionally, in the antenna devices 400 and 500 of the second embodiment, the coils 430 and 530 are formed by coiling, around respective the magnetic portions 410 and 510, the litz wires each formed by combining a plurality of conducting wires. Since the litz wire is thus used, current flows in a dispersed manner even in a case where AC resistance of the conducting wire is increased due to the skin effect. Therefore, a power loss can be reduced by suppressing the AC resistance, and the magnetic field can be efficiently generated.

Third Embodiment

In an antenna device of a first embodiment, square magnetic pieces are arranged to form a magnetic portion, and in an antenna device of a second embodiment, rectangular magnetic pieces are arranged to form a magnetic portion, but in an antenna device of the present embodiment, triangular magnetic pieces are arranged to form a magnetic portion.

FIGS. 16A, 16B, and 16C are views from three sides illustrating an antenna device according to a third embodiment of the present disclosure. An antenna device 600 of the present embodiment mainly includes a magnetic portion 610, resin members 620, and a coil 630. Meanwhile, since the resin members 620 (resin members 620a and 620b), and coil 630 are similar to resin members and a coil of the first embodiment, the description will be omitted.

The magnetic portion 610 is paved with magnetic pieces 610a arranged at equal intervals. Each magnetic piece 610a is shaped in a triangular prism. Similar to the first embodiment, the magnetic piece 610a is produced by cutting, into individual pieces, a plate-shaped magnetic body shaped in a rectangular parallelepiped like a magnetic portion 11.

Figure 17:
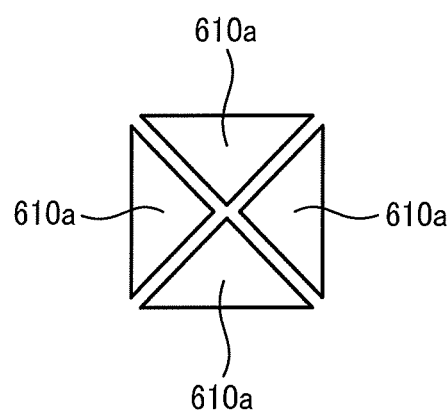
FIG. 17 is an explanatory view for a magnetic piece.

FIG. 17 is an explanatory view for the magnetic piece. As illustrated in FIG. 17, in the present embodiment, the magnetic piece 610a is shaped in a right triangle formed by dividing a square by two diagonal lines. In the present embodiment, the magnetic piece 610a is shaped in a right triangle having a long side of √2 mm and a short side 1 mm, for example.

Thus, since the magnetic pieces 610a each shaped in a triangular prism are arranged at predetermined intervals to form the magnetic portion 610 in the antenna device 600 of the third embodiment, communicable area can be more expanded than in a case of an antenna device 10 in which a single-plate magnetic body is used to form the magnetic portion 11. Since the magnetic piece 610a is shaped in the triangular prism, the number of side surfaces is increased, the more number of magnetic fluxes can be generated, and the communicable area can be expanded.

Additionally, in the antenna device 600 of the third embodiment, the coil 630 is formed by coiling, around the magnetic portion 610, a litz wire formed by combining a plurality of conducting wires. Since the litz wire is thus used, current flows in a dispersed manner even in a case where AC resistance of the conducting wire is increased due to the skin effect. Therefore, a power loss can be reduced by suppressing the AC resistance, and the magnetic field can be efficiently generated.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. An antenna device comprising:
    a magnetic portion including a plurality of magnetic pieces arranged, the plurality of magnetic pieces being individual pieces of a magnetic body; and
    a coil formed of a litz wire coiled around the magnetic portion, the litz wire including a bundle of a plurality of conducting wires.

2. The antenna device according to claim 1, wherein the plurality of magnetic pieces are arranged at equal intervals.

3. The antenna device according to claim 1, wherein the plurality of magnetic pieces are arranged without any gap.

4. The antenna device according to claim 1, wherein the plurality of magnetic pieces are arranged with a gap of less than 50% of one side of the magnetic piece.

5. The antenna device according to claim 1, wherein the plurality of magnetic pieces are arranged with a gap of 50% or more of one side of the magnetic piece.

6. The antenna device according to claim 1, wherein each of the plurality of magnetic pieces has a rectangular parallelepiped shape.

7. The antenna device according to claim 1, wherein each of the plurality of magnetic pieces has a triangular prism shape.

8. The antenna device according to claim 1, wherein the litz wire is coiled around the magnetic portion a plurality of times with a predetermined interval kept between adjacent turns of the litz wire.

9. The antenna device according to claim 8, wherein each of the plurality of magnetic pieces has a rectangular parallelepiped shape.

10. The antenna device according to claim 8, wherein each of the plurality of magnetic pieces has a triangular prism shape.

11. A communication device comprising:
an antenna device including:
- a magnetic portion including a plurality of magnetic pieces arranged, the plurality of magnetic pieces being individual pieces of a magnetic body; and
- a coil formed of a litz wire coiled around the magnetic portion, the litz wire including a bundle of a plurality of conducting wires; and a communication unit coupled to the antenna device, to communicate with an external device.

12. A method for producing an antenna device, the method comprising:
cutting a magnetic body into individual pieces to produce a plurality of magnetic pieces;
arranging the plurality of magnetic pieces to form a magnetic portion; and
coiling a litz wire around the magnetic portion including the magnetic pieces arranged, the litz wire including a plurality of conducting wires.

13. The antenna device according to claim 1, wherein the magnetic body has flexibility.

\* \* \* \* \*